(12) United States Patent
Ke et al.

(10) Patent No.: US 11,877,130 B2
(45) Date of Patent: Jan. 16, 2024

(54) AUDIO CONTROLS IN ONLINE CONFERENCES

(71) Applicant: Hewlett-Packard Development Company, L.P., Spring, TX (US)

(72) Inventors: Hsiang-Ta Ke, Taipei (TW); Pei Song Tang, Taipei (TW); Wei-Yu Chen, Taipei (TW)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 44 days.

(21) Appl. No.: 17/696,933

(22) Filed: Mar. 17, 2022

(65) Prior Publication Data

US 2023/0300525 A1 Sep. 21, 2023

(51) Int. Cl.
  *H04R 3/00* (2006.01)
  *G06T 7/70* (2017.01)
  *H04R 1/40* (2006.01)
  *G10L 17/06* (2013.01)
  *H04L 65/4038* (2022.01)
  *G10L 17/02* (2013.01)

(52) U.S. Cl.
  CPC ............... *H04R 3/005* (2013.01); *G06T 7/70* (2017.01); *G10L 17/02* (2013.01); *G10L 17/06* (2013.01); *H04L 65/4038* (2013.01); *H04R 1/406* (2013.01); *G06T 2207/30196* (2013.01); *H04R 2201/401* (2013.01); *H04R 2430/01* (2013.01)

(58) Field of Classification Search
  CPC .. H04R 3/005; H04R 1/406; H04R 2201/401; H04R 2430/01; G06T 7/70; G06T 2207/30196; G10L 17/02; G10L 17/06; H04L 65/4038
  USPC .................................................. 381/92, 122
  See application file for complete search history.

(56) References Cited

U.S. PATENT DOCUMENTS

| | | | |
|---|---|---|---|
| 6,301,429 B1 | 10/2001 | Hirosawa |
| 7,298,962 B2 | 11/2007 | Quan et al. |
| 8,254,758 B2 | 8/2012 | Quan et al. |
| 9,060,094 B2 | 6/2015 | Thapa |
| 9,060,182 B2 | 6/2015 | Quan et al. |
| 10,129,805 B2 | 11/2018 | Quan et al. |
| 10,536,756 B2 | 1/2020 | Quan et al. |
| 2004/0228605 A1 | 11/2004 | Quan et al. |
| 2008/0044154 A1 | 2/2008 | Quan et al. |
| 2013/0058628 A1 | 3/2013 | Quan et al. |
| 2013/0170857 A1 | 7/2013 | Conklin |
| 2019/0037281 A1 | 1/2019 | Quan et al. |

(Continued)

FOREIGN PATENT DOCUMENTS

| | | | | |
|---|---|---|---|---|
| CN | 106063238 A | * | 10/2016 | ............. G10L 25/51 |
| EP | 2296270 A2 | | 3/2011 | |
| WO | 2004/102567 A2 | | 11/2004 | |

*Primary Examiner* — Ammar T Hamid
(74) *Attorney, Agent, or Firm* — Knobbe, Martens, Olson & Bear, LLP

(57) ABSTRACT

In an example, a computing device includes a microphone array and a processor. The processor may transmit an audio stream of a presentation to an online conference. Further, the processor may receive audio data via the microphone array while the audio stream is being transmitted. In response to determining the audio data is coming from a presenter of the presentation, the processor may perform a fade audio operation to control an audio level of the audio stream.

19 Claims, 9 Drawing Sheets

(56) References Cited

U.S. PATENT DOCUMENTS

2020/0110162 A1* 4/2020 Celinski ................ G01S 5/0284
2023/0124859 A1* 4/2023 Pandey ................ H04M 3/568
                                                     381/71.1

* cited by examiner

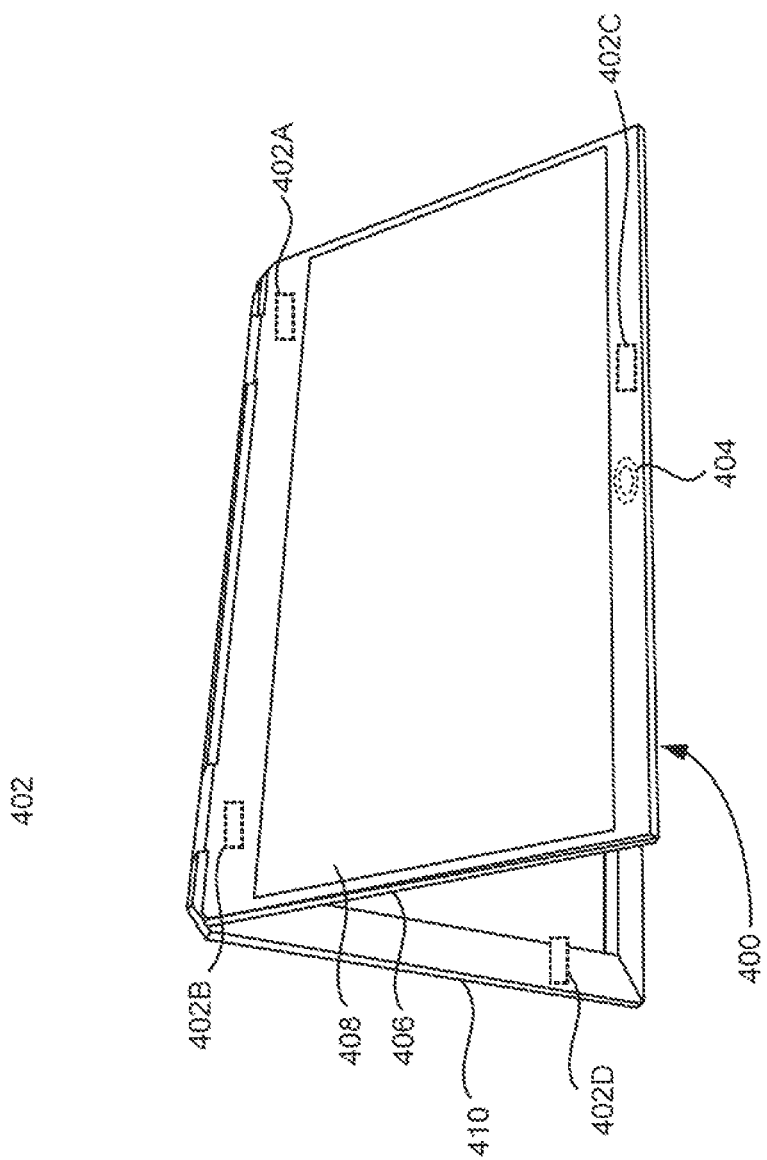

AUDIO CONTROLS IN ONLINE CONFERENCES

BACKGROUND

An online conference is a telephone call between two or more callers or users (e.g., a group of participants) at geographically distributed locations, which allows each participant to be able to speak to, and listen to, other participant(s) simultaneously. A conference call among multiple participants can be conducted via a voice conference bridge or a centralized server, which connects numerous endpoint devices (e.g., Voice over Internet Protocol (VoIP) devices, Public Switched Telephone Network (PSTN) telephones, or the like) associated with the participants using appropriate communication protocols and mixes the various incoming voice streams from the plurality of participants either at the endpoint devices or at the conference bridge.

During a conference call, a Web conferencing tool enables the group of participants to organize and attend meetings online by allowing a presenter in the group of the participants at the conference call to run an application or to present a material via a hosting device and share the application or material (i.e., a presentation) with the rest of the group to view in real time. For example, such Web conferencing tool enables the presenter to perform live demonstrations in real time, collaborate documents with colleagues, and provide training to customers and employees.

BRIEF DESCRIPTION OF THE DRAWINGS

Examples are described in the following detailed description and in reference to the drawings, in which:

FIG. 4A is a schematic representation of an example computing device, depicting placement of microphones to determine audio data of a presenter and a camera to detect a focus of the presenter;

DETAILED DESCRIPTION

Figure 1:
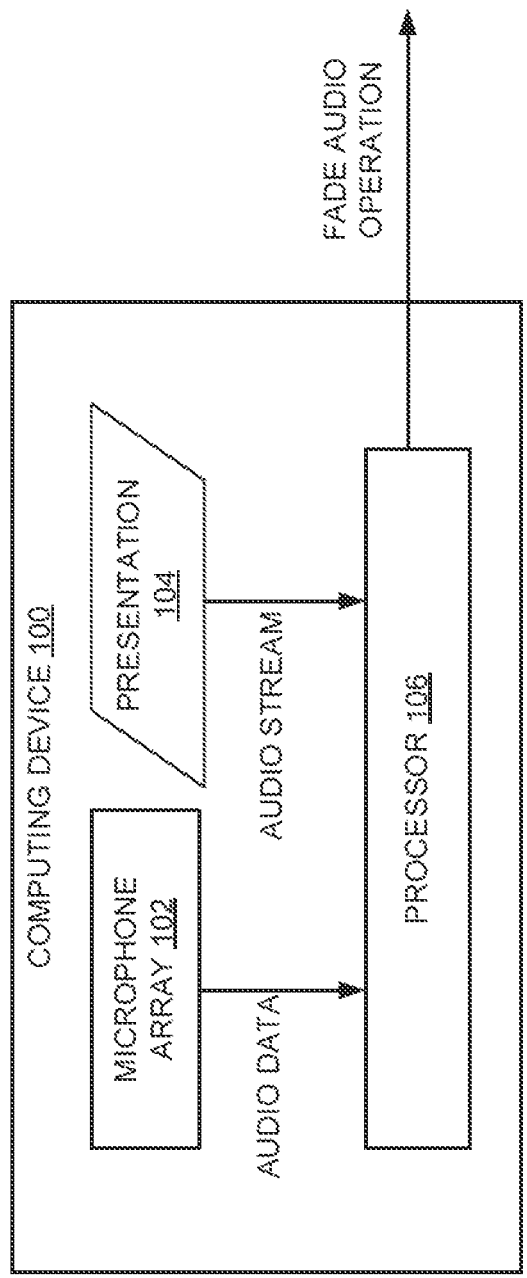
FIG. 1 is a block diagram of an example computing device, including a processor to perform a fade audio operation on an audio stream of a presentation in an online conference.

With the development and proliferation of online tools and networking capabilities of desktop applications such as word processing applications, spreadsheet applications, presentation applications, and the like, online collaboration has become a real and a part of daily life. A wide variety of online collaborative sessions such as social web group discussion threads (e.g., asynchronous or synchronous), chat rooms, online conferences, and presentations (e.g., WebEx™, GoToMeeting™, and the like), online training and educational classes (e.g., WizIQ™, DimDim™, Blackboard™, and the like), and online co-editing of documents (e.g., DropBox™, GoogleDocs™, and the like) are available.

In such examples, an online conference allows participants from around the world to communicate and share ideas. During the online conference, a presenter (i.e., one of the participants) may have the ability to share and control a presentation. In this example, the presenter may share data, make presentation, and the like in an online conference session. An example presentation may include an outgoing audio stream (or audio) of a material being presented and/or an application being run via a computing device of the presenter. During the online conference, an audio stream of the presentation may often be transmitted to the online conference in addition to, and in separation from, outgoing audio data of the presenter (e.g., voice-over of the presenter while the audio stream is transmitted) at the conference call. Thus, the audio stream of the presentation may interfere with the presenter's voice over. Thus, transmitting a mix of both the presentation's audio stream and the presenter's audio data may interfere with one another and deteriorate the audio quality of the conference call. Also, when a microphone is not muted at the presenter's side, a background noise (e.g., a non-human voice, a human voice other than the presenter, the presenter voice not related to the online conference, and the like) may be captured, which may interfere with the audio stream of the presentation.

Examples described herein may provide a computing device including a processor, a camera, and an audio input device (e.g., a microphone array). The processor may transmit an audio stream of a presentation to an online conference. Further, the processor may detect, via the camera, a focus of the presenter of the presentation on the online conference (i.e., a focus of the presenter on the presentation being displayed on the computing device) while the audio stream is being transmitted. Furthermore, the processor may determine whether audio data is coming from a presenter of the presentation via the audio input device.

In response to determining that the presenter is focusing on the online conference and the audio data is coming from the presenter, the processor may perform a fade-out audio operation to reduce an audio level of the audio stream while transmitting the audio data of the presenter to the online conference. In response to determining that the presenter is not focusing on the online conference or the audio data is not coming from the presenter, the processor may perform a fade-in audio operation to increase the audio level of the audio stream while preventing transmission of the audio data of the presenter. Thus, examples described herein may detect the presenter's voice and presenter's focus to perform the fade-in or fade-out audio operation on the audio stream to avoid the interference between the audio stream and the audio data, and to enhance the user experience in the online conference.

In the following description, for purposes of explanation, numerous specific details are set forth in order to provide a thorough understanding of the present techniques. However, the example apparatuses, devices, and systems, may be practiced without these specific details. Reference in the specification to "an example" or similar language means that a particular feature, structure, or characteristic described may be included in at least that one example but may not be in other examples.

Turning now to the figures, FIG. 1 is a block diagram of an example computing device 100, including a processor 106 to perform a fade audio operation on an audio stream of a presentation 104 in an online conference. Example computing device 100 can be a laptop, a desktop, a smartphone, a tablet, or any other device that can support an application or a platform to connect to the online conference. The online conference or a web conference may allow participants to communicate over the Internet. In the online conference, each participant may sit at a respective computing device while being connected to other participants, via desktop sharing software, audio conferencing, and the like.

In such examples, computing device 100 enables a presenter (e.g., one of the participants) of the online conference to share presentation 104 (e.g., an application he/she runs, a material he/she presents, or the like) at the conference call. Example presentation 104 can be a digital document, an application, or a program that includes an outgoing audio stream and being displayed on a display component of computing device 100. In this example, computing device 100 may include the display component (e.g., a monitor, a display screen, or the like) to display presentation 104.

Further, computing device 100 includes a microphone array 102. For example, microphone array 102 includes a set of microphones to capture audio data. The set of microphones may be placed at different locations on computing device 100 to capture the audio data. An example placement of the microphones is depicted in FIG. 4A.

Furthermore, computing device 100 includes processor 106. As used herein, the term "processor" may refer to, for example, a central processing unit (CPU), a semiconductor-based microprocessor, a digital signal processor (DSP) such as a digital image processing unit, or other hardware devices or processing elements suitable to retrieve and execute instructions stored in a storage medium, or suitable combinations thereof. Processor 106 may, for example, include single or multiple cores on a chip, multiple cores across multiple chips, multiple cores across multiple devices, or suitable combinations thereof. Processor 106 may be functional to fetch, decode, and execute instructions as described herein.

During operation, processor 106 may transmit the audio stream of presentation 104 to an online conference. Further, processor 106 may receive audio data via microphone array 102 while the audio stream is being transmitted. Furthermore, processor 106 may determine whether the audio data is coming from the presenter of presentation 104. In an example, processor 106 may estimate a location or direction of a sound source relative to computing device 100 based on the received audio data. In an example, processor 106 may determine the location or direction of the sound source based on a time difference of arrival of an audio signal of the audio data between a set of microphones of microphone array 102.

In another example, processor 106 may determine the location or direction of the sound source based on an intensity of an audio signal of the audio data detected individually by the set of microphones of microphone array 102. Further, processor 106 may determine whether the audio data is coming from the presenter of presentation 104 based on the estimated location or direction of the sound source. For example, processor 106 may enable to define a reference location with respect to the set of microphones and determine that the audio data is coming from the presenter of presentation 104 if the audio data is coming from the reference location.

In response to determining the audio data is coming from the presenter of presentation 104, processor 106 may perform a fade audio operation to control an audio level of the audio stream. An example fade audio operation may include a fade-in audio operation and a fade-out audio operation. The fade audio operation may gradually increase (e.g., fade-in) or decrease (e.g., fade-out) the audio level of the audio stream.

The fade-in audio operation may gradually increase the audio level from a first level to a second level and the fade-out audio operation may gradually decrease the audio level from the second level to the first level. In an example, the fade-out audio operation gradually reduces the audio level from an original level to silence and the fade-in audio operation gradually increases the audio level from silence to the original level.

In response to determining the audio data is coming from the presenter of presentation 104, processor 106 may perform the fade-out audio operation to reduce the audio level of the audio stream while the audio data of the presenter is being transmitted to the online conference. In response to determining the audio data is not coming from the presenter of presentation 104, processor 106 may perform a fade-in audio operation to increase the audio level of the audio stream of presentation 104 while preventing transmission of the audio data of the presenter.

Figure 2:
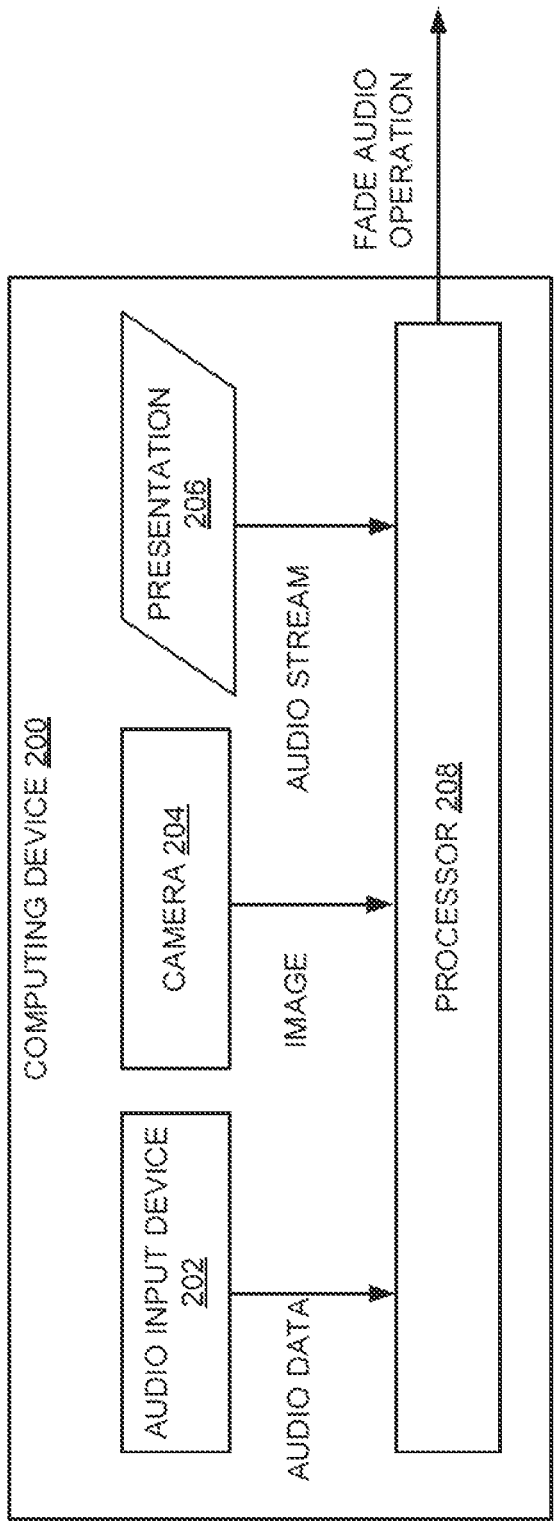
FIG. 2 is a block diagram of an example computing device, including a processor to trigger a fade audio operation on an audio stream of a presentation based on a focus of a presenter.

FIG. 2 is a block diagram of an example computing device 200, including a processor 208 to trigger a fade audio operation on an audio stream of a presentation 206 based on a focus of a presenter. As shown in FIG. 2, computing device 200 includes an audio input device 202 and a camera 204. For example, audio input device 202 includes a microphone or an array of microphones to receive audio data corresponding to the presenter operating computing device 200. Further, camera 204 may be an infrared camera placed on top of a display panel of computing device 200 or may be an external device connected to computing device 200.

Further, computing device 200 includes processor 208. During operation, processor 208 may transmit an audio stream of presentation 206 to an online conference. In this example, presentation 206 may include an outgoing audio stream with or without visual data. Example presentation 206 may be a livestream presentation or a pre-recorded presentation. Further, processor 208 may detect, via camera 204, a focus of the presenter of presentation 206 on the online conference. In an example, processor 208 captures an image of the presenter operating computing device 200 via camera 204. Further, processor 208 may detect an angular position of the presenter's eye, the presenter's head, the presenter's body, or any combination thereof using the captured image. Furthermore, processor 208 may detect the focus of the presenter on the online conference based on the detected angular position. In an example, camera 204 detects the angular position of an eye of the presenter to detect a direction of the focus of the presenter. In another example, camera 204 detects a convergence of eyes of the presenter to detect a direction of the focus of the presenter. In yet another example, camera 204 detects the angular position of a head of the presenter to detect the direction of the focus of the presenter. An example process to detect the focus of the presenter is described in FIG. 4C.

In response to determining that the presenter is focusing on the online conference, processor 208 may trigger a fade audio operation to control an audio level of the audio stream. In this example, the audio level of the audio stream is controlled based on audio data captured via audio input device 202. In an example, in response to determining that the presenter is focusing on the online conference, processor 208 may enable (e.g., turn on) audio input device 202 to capture the audio data while the audio stream is being transmitted. Further, processor 208 may estimate a location or direction of a sound source relative to audio input device 202 based on the captured audio data. Further, processor 208 may determine whether the audio data is coming from the presenter of presentation 206 based on the estimated location or direction of the sound source.

In response to determining the audio data is coming from the presenter of presentation 206, processor 208 may perform the fade audio operation to control the audio level of the audio stream. In this example, processor 208 may perform a fade-out audio operation to reduce the audio level of the audio stream and transmit the audio data of the presenter to the online conference in response to determining the audio data is coming from the presenter of presentation 206. In another example, processor 208 may perform a fade-in audio operation to increase the audio level of the audio stream and prevent transmitting of the audio data of the presenter in response to determining the audio data is not coming from the presenter of presentation 206.

In response to determining that the presenter is not focusing on the online conference (i.e., not paying attention to presentation 206 being displayed on computing device 200), processor 208 may disable the fade audio operation and disable (e.g., turn off) the audio input device.

Figure 3:
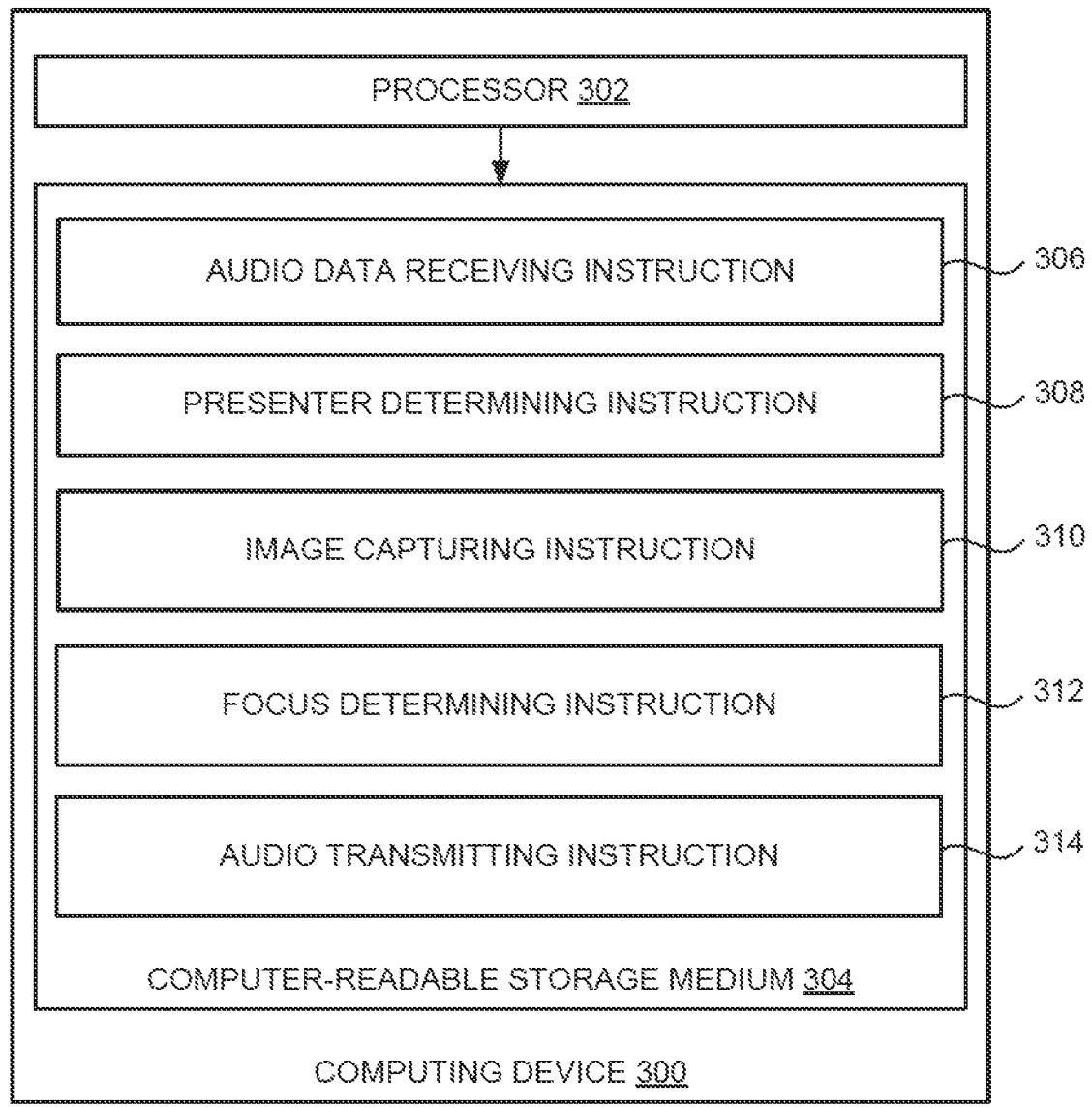
FIG. 3 is a block diagram of an example computing device including a non-transitory computer-readable storage medium, storing instructions to selectively transmit either audio data of a presenter or an audio stream of a presentation to an online conference.

FIG. 3 is a block diagram of an example computing device 300 including a non-transitory computer-readable storage medium 304, storing instructions to selectively transmit either audio data of a presenter or an audio stream of a presentation to an online conference. Computing device 300 may include a processor 302 and computer-readable storage medium 304 communicatively coupled through a system bus. Processor 302 may be any type of central processing unit (CPU), microprocessor, or processing logic that interprets and executes computer-readable instructions stored in computer-readable storage medium 304.

Computer-readable storage medium 304 may be a random-access memory (RAM) or another type of dynamic storage device that may store information and computer-readable instructions that may be executed by processor 302. For example, computer-readable storage medium 304 may be synchronous DRAM (SDRAM), double data rate (DDR), Rambus® DRAM (RDRAM), Rambus® RAM, and the like, or storage memory media such as a floppy disk, a hard disk, a CD-ROM, a DVD, a pen drive, and the like. In an example, computer-readable storage medium 304 may be a non-transitory computer-readable medium, where the term "non-transitory" does not encompass transitory propagating signals. In an example, computer-readable storage medium 304 may be remote but accessible to computing device 300.

Computer-readable storage medium 304 may store instructions 306, 308, 310, 312, and 314. Instructions 306 may be executed by processor 302 to receive audio data via a microphone array while an audio stream of the presentation is being transmitted to an online conference. Instructions 308 may be executed by processor 302 to determine whether the audio data is coming from a presenter of the presentation.

In an example, instructions to determine whether the audio data is coming from the presenter include instructions to:
extract frequency components of human voice from the audio data, and
determine whether the audio data is coming from the presenter using the extracted frequency components. In this example, frequency components of non-human voice (i.e., background noise) can be filtered from the audio data.

In another example, instructions 308 to determine whether the audio data is coming from the presenter include instructions to:
create a hyperbola of a first microphone and a second microphone of the microphone array, the first microphone and the second microphone being disposed on a front side of a display panel of computing device 300 and pointed towards an operator of computing device 300,
determine a location of a sound source with respect to the hyperbola, and
determine whether the audio data is coming from the presenter based on the location of the sound source with respect to the hyperbola.

Instructions 310 may be executed by processor 302 to capture an image of the presenter operating computing device 300 via a camera. Instructions 312 may be executed by processor 302 to determine whether the presenter is focusing on the online conference based on the captured image. In an example, instructions 312 to determine whether the presenter is focusing on the online conference include instructions to extract a user position characteristic from the image. An example user position characteristic includes user eye position information, user head position information, user body position information, or any combination thereof.

Further, the instructions may compare, based on the user position characteristic, the image to a database including images indicative that users are focusing on corresponding computing devices, and images indicative that users are not focusing on corresponding computing devices. Furthermore, the instructions may determine, based on the comparison, whether the presenter is focusing on computing device 300.

Instructions 314 may be executed by processor 302 to selectively transmit either the audio data of the presenter or the audio stream of the presentation to the online conference based on determining whether the audio data is coming from the presenter and the presenter is focusing on the online conference.

In response to determining that the audio data is coming from the presenter and the presenter is focusing on the online conference, instructions 314 may transmit the audio data of the presenter to the online conference while preventing the transmission of the audio stream of the presentation. In response to determining that the audio data is not coming from the presenter, the presenter is not focusing on the online conference, or both, instructions 314 may transmit the audio stream of the presentation to the online conference while preventing the transmission of the audio data of the presenter. Thus, examples described herein may avoid interference between the audio stream of the presentation and the audio data of the presenter.

FIG. 4A is a schematic representation of an example computing device 400, depicting placement of microphones 402A, 402B, 402C, and 402D to determine audio data of a presenter and a camera 404 to detect a focus of the presenter. As shown in FIG. 4A, computing device 400 includes a display housing 406 including a display screen 408. Further, computing device 400 includes a base housing 410 pivotally connected to display housing 406. In the example shown in FIG. 4A, computing device 400 is in a tent mode. The term "tent mode" may refer to a configuration in which display screen 408 is facing the user in landscape or inverted landscape orientation and is more than 180° open from a clamshell-closed state but may not be in the tablet (360°) mode. The term "clamshell-closed mode" may refer to a configuration in which display screen 408 is facing a keyboard of base housing 410 and the two are in parallel.

Further, computing device 400 includes a microphone array having multiple microphones 402A, 402B, 402C, and 402D placed at different locations on computing device 400. In the example shown in FIG. 4A, microphones 402A, 402B, and 402C are placed in display housing 406 and microphone 402D is placed in base housing 410. Further, computer device 400 may include camera 404 such as an infrared camera to capture the image in front of computing device 400. In an example, the captured image may be used to determine a focus of the presenter on an online conference.

Figure 4B:
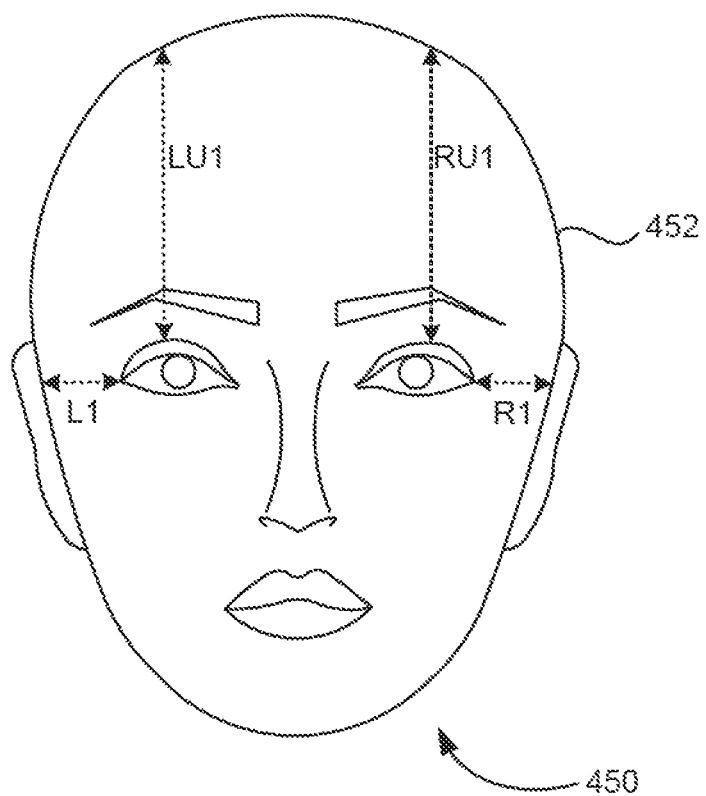
FIG. 4B is a schematic representation of an example image of the presenter captured via the camera of FIG. 4A to detect the focus of the presenter.

When presenter's eyes are not focusing on the online conference, a fade audio operation and microphones 402A, 402B, 402C, and 402D may be disabled. When presenter's eyes are focusing on the online conference, the fade audio operation and microphones 402A, 402B, 402C, and 402D may be enabled. An example to determine the focus of the presenter on the online conference is described with respect to FIG. 4B FIG. 4B is a schematic representation of an example image 450 of the presenter captured via camera 404 of FIG. 4A to detect the focus of the presenter. As shown in FIG. 4B, image 450 includes a base line 452, which may indicate an edge of a face of the presenter in the captured image. Further, L1 may be a distance between an end of a left eye and base line 452 in a horizontal direction (e.g., x-axis). Similarly, R1 may be a distance between an end of a right eye and base line 452 in the horizontal direction. Further, LU1 may be a distance from center of the left eye to base line 452 in a vertical direction (e.g., y-axis) and RU1 may be a length from center of the right eye to base line 452 in the vertical direction as shown in FIG. 4B. Further, values of L1, R1, LU1, and RU1 may be stored in a database (e.g., a non-volatile memory of a computing device) as base line data.

Furthermore, the base line data may be analyzed to detect whether the presenter is focusing on the online conference, for instance, as shown below:
- If (L1/R1<0.2) or (L1/R>5), then it is determined that the presenter is focusing on the online conference. In this example, an attribute "presenter_focus_flag" is set as "true".
- If (LU1/(Base−LU1)>3) or (RU1/(Base−RU1)>3), then it is determined that the presenter is not focusing on the online conference. In this example, the attribute "presenter_focus_flag" is set as "false".

When "presenter_focus_flag"="true", the fade audio operation and the microphone array may be enabled (e.g., turned on). When "presenter_focus_flag"="false", the fade audio operation and the microphone array may be disabled (e.g., turned off).

Figure 4C:
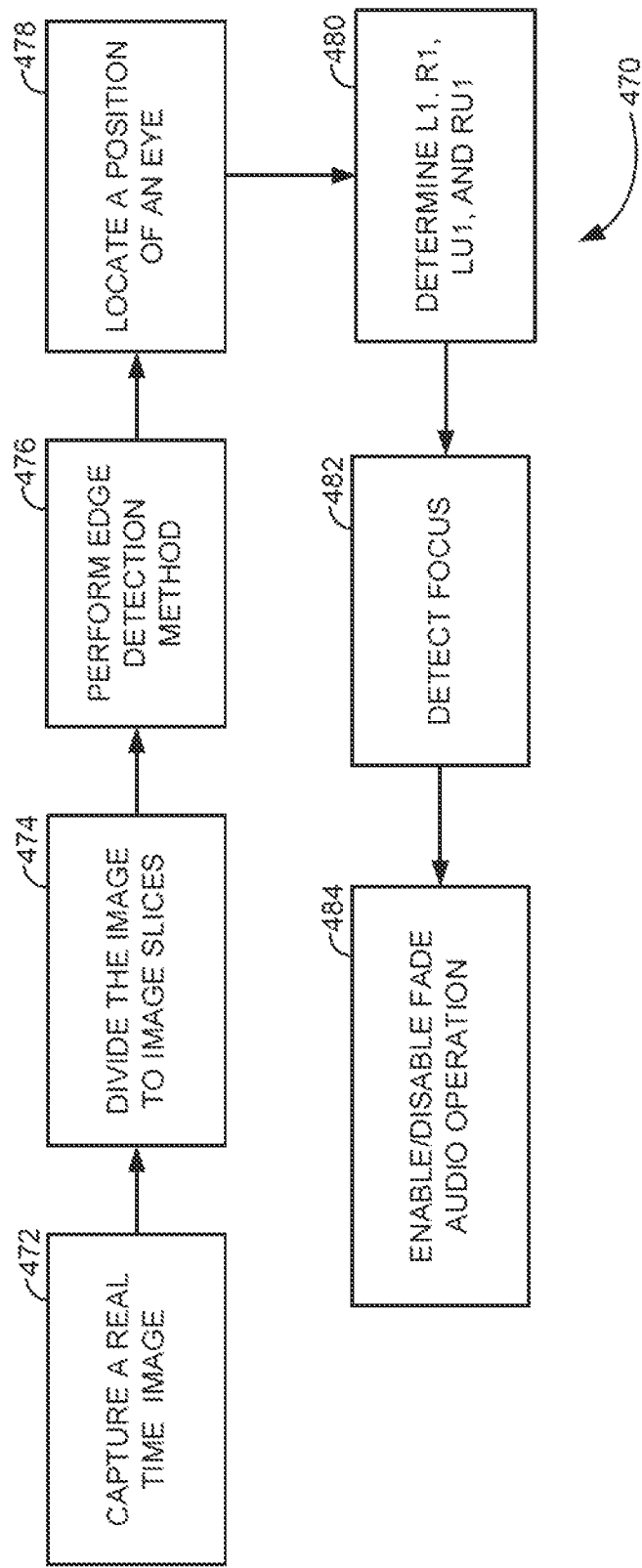
FIG. 4C is a flow diagram illustrating an example computer-implemented method for enabling the fade audio operation in response to a determination that the presenter is focusing on an online conference.

FIG. 4C is a flow diagram illustrating an example computer-implemented method 470 for enabling a fade audio operation in response to determining that the presenter is focusing on the online conference. At 472, a real time image of the presenter may be captured via the camera (e.g., camera 404 of FIG. 4A). At 474, the captured image may be processed to divide the captured image into multiple image slices. At 476, an edge detection method may be applied on the image slices to extract edges from the captured image. For example, a Sobel edge detection technique can be used to extract the edges from facial images which are used to detect face (e.g., an edge of the face, a facial feature such as an eye, or the like). At 478, a position of a left eye, a right eye, or both may be located using the extracted edges. At 480, base line data (e.g., L1, R1, LU1, and RU1 as shown in FIG. 4B) may be determined using the position of the left eye and/or the right eye.

At 482, a focus of the presenter on the online conference may be detected based on the base line data. At 484, the fade audio operation may be enabled based on the detected focus. For example, in response to detecting that the presenter is focusing on the online conference, the fade audio operation may be enabled to control an audio level of the audio stream. Further, in response to determining that the presenter is not focusing on the online conference, the fade audio operation may be disabled.

Figure 5A:
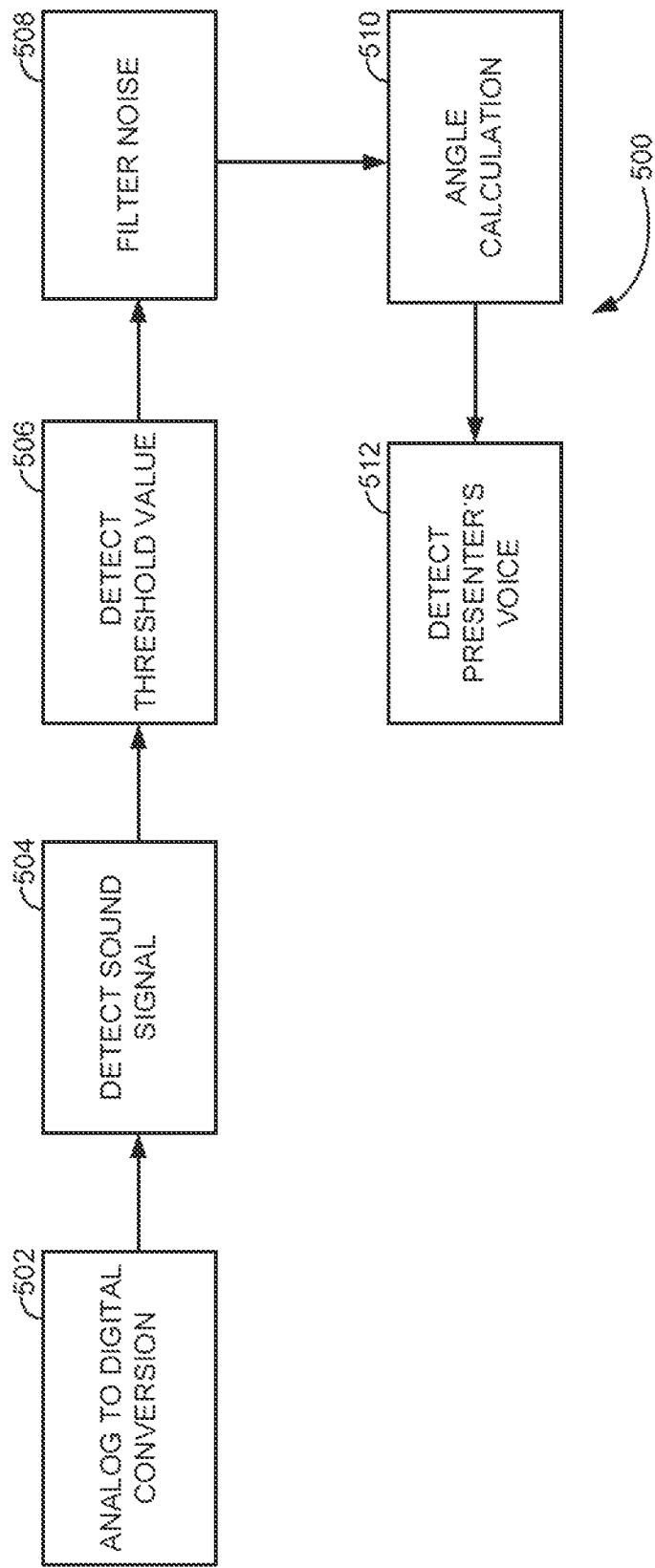
FIG. 5A is a flow diagram illustrating an example computer-implemented method for detecting a presenter's voice to perform a fade audio operation.

FIG. 5A is a flow diagram illustrating an example computer-implemented method 500 for detecting a presenter's voice to perform a fade audio operation. At 502, an analog-to-digital conversion of audio data captured via a microphone array is performed. For example, the audio data captured by a microphone may be converted into a digital signal using an analog-to-digital converter. At 504, an audio signal in the digital signal may be detected. The audio signal may be a representation of sound using a series of binary numbers of the digital signal.

At 506, a threshold value may be detected. For example, the threshold value may refer to a frequency range of human being's vocal i.e., 85 to 180 Hz for males and 165 to 255 Hz for females. At 508, noise may be filtered. For example, the audio signal which is not in the above threshold value may be detected and then removed. In an example, the audio signal may be transferred from time domain to frequency domain by fast fourier transform (FFT). Upon transferring, the frequency X may be filtered in the above two ranges (i.e., 85 to 180 Hz and 165 to 255 Hz) as valid audio input.

At 510, an angle of the audio source may be calculated. For example, upon filtering out the human's voice, the presenter's voice detection may be performed to check if the person speaking is the presenter or someone else beside the presenter. In this example, the microphone array (e.g., microphones 402A, 402B, 402C, and 402D of FIG. 4A) may be used to detect the direction of the audio data based on a time difference of arrival of the audio signal. An example method to detect the direction of the audio is described in FIG. 5B. At 512, the presenter's voice may be detected. Further, the fade audio operation may be performed in response to detecting the presenter's voice.

Figure 5B:
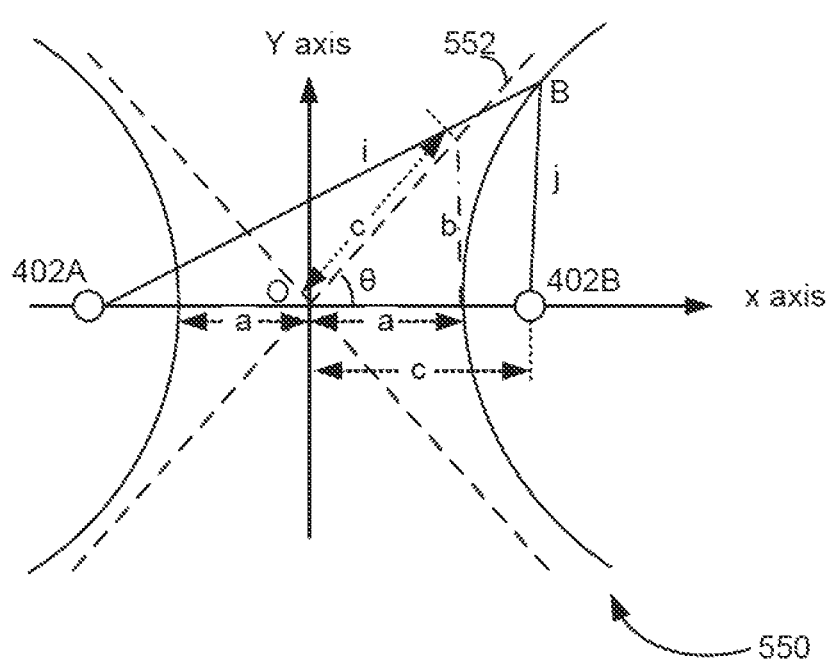
FIG. 5B depicts an example hyperbola to calculate an angle of an audio source as described in block 510 of FIG. 5A.

FIG. 5B depicts an example hyperbola 550 to calculate the angle of the audio source as described in block 510 of FIG. 5A. Hyperbola 550 may be a type of smooth curve lying in a plane and defined by its geometric properties or by equations to detect a sound source of the audio data (e.g., voice of the presenter). In an example, the position of the sound source of the audio data is estimated by using an audio signal input to a microphone array (e.g., microphones 402A, 402B, 402C, and 402D of FIG. 4A). Further, noise may be distinguished by comparing the estimated position of the sound source and a previously stored reference position with each other.

Consider computing device 400 of FIG. 4A, where microphones 402A, 402B, 402C, and 402D are placed at different positions on computing device 400 to detect a position of the presenter. In this example, microphones 402A and 402B are used to decide an area for valid presenter and microphones 402C and 402D are used to detect if the audio data is coming from a front side or a back side of computing device 400. At first, initial values of microphones 402A, 402B, 402C, and 402D are obtained. Further, real time amplitude of audio data received by microphones 402A, 402B, 402C, and 402D may be obtained. Upon determining that the audio data is coming from the front side using microphones 402C and 402D, then microphones 402A and 402B may be used to determine whether the audio data is coming from the presenter as follows.

In the example FIG. 5B, microphones 402A and 402B are defined as focus points of hyperbola 550 and the sound source is at location B. Consider that the sound source is approaching to any point of hyperbola 550. An example equation of hyperbola 550 is as shown below:

$$\frac{x^2}{a^2} - \frac{y^2}{c^2 - a^2} = 1$$

where a is the distance along the x-axis from an origin O to a nearest point on hyperbola 550, where b is the distance in a direction parallel with the y-axis from the point at which the hyperbola intersects the x-axis to an asymptote 552, and where c is the distance in a direction along the asymptote 552 from the origin O to a point at which distance b intersects asymptote 552, 2*c is a distance between microphones 402A and 402B, which is pre-defined, 2*a=i−j, where i is the distance of the voice source to microphone 402A, j is the distance of the voice source to MIC2, where θ is an acute angle formed by the asymptote of a hyperbola with the x-axis in the first quadrant, θ=arc_COS (a/c)

i.e., θ=arc_COS ((time difference of arrival of an audio signal at microphones 402A and 402B)*v/2c), where v=347 m/sec.

In an example, when θ<45, it is defined as the voice is not coming from the presenter. Thus, an attribute "presenter_voice_flag" may be set as "false". Further, when θ≥45, it is defined as the voice is from the presenter and the attribute "presenter_voice_flag" may be set as "true". When "presenter_voice_flag"="false", the fade out audio operation may not be triggered. Further, when "presenter_voice_flag" ="true", the fade out audio operation may be triggered.

For example, an array for the fade-in and fade-out may be created and multiplied by signal amplitude to create a smooth amplitude change. By indexing a portion of the audio signal, the fade audio operation may be applied as shown below.

Fade-out audio data:

[original audio input amplitude]×[a1, a2, a3, . . . ]=[new audio output amplitude], where [a1, a2, a3, . . . ] are defined sample points of linear equation whose slope is negative Fade-in audio data:

[original input audio amplitude]×[b1, b2, b3, . . . ]=[new audio output amplitude]

where [b1, b2, b3, . . . ] is a predefined sample point of linear equation whose slope is positive.

An example function for creating a fade audio effect is as shown below:

FAD_in_out (0, 1, sampling_fade[number], mode)

Where 0 is a lower limit value of a start amplitude, 1 is a higher limit value of an end amplitude, and sampling fade[number] is the array which lists the fade-in/fade-out samples ratios. Mode=0 is fade-in, mode=1 is fade-out, which may create a linear ramp as the fade.

Figure 6:
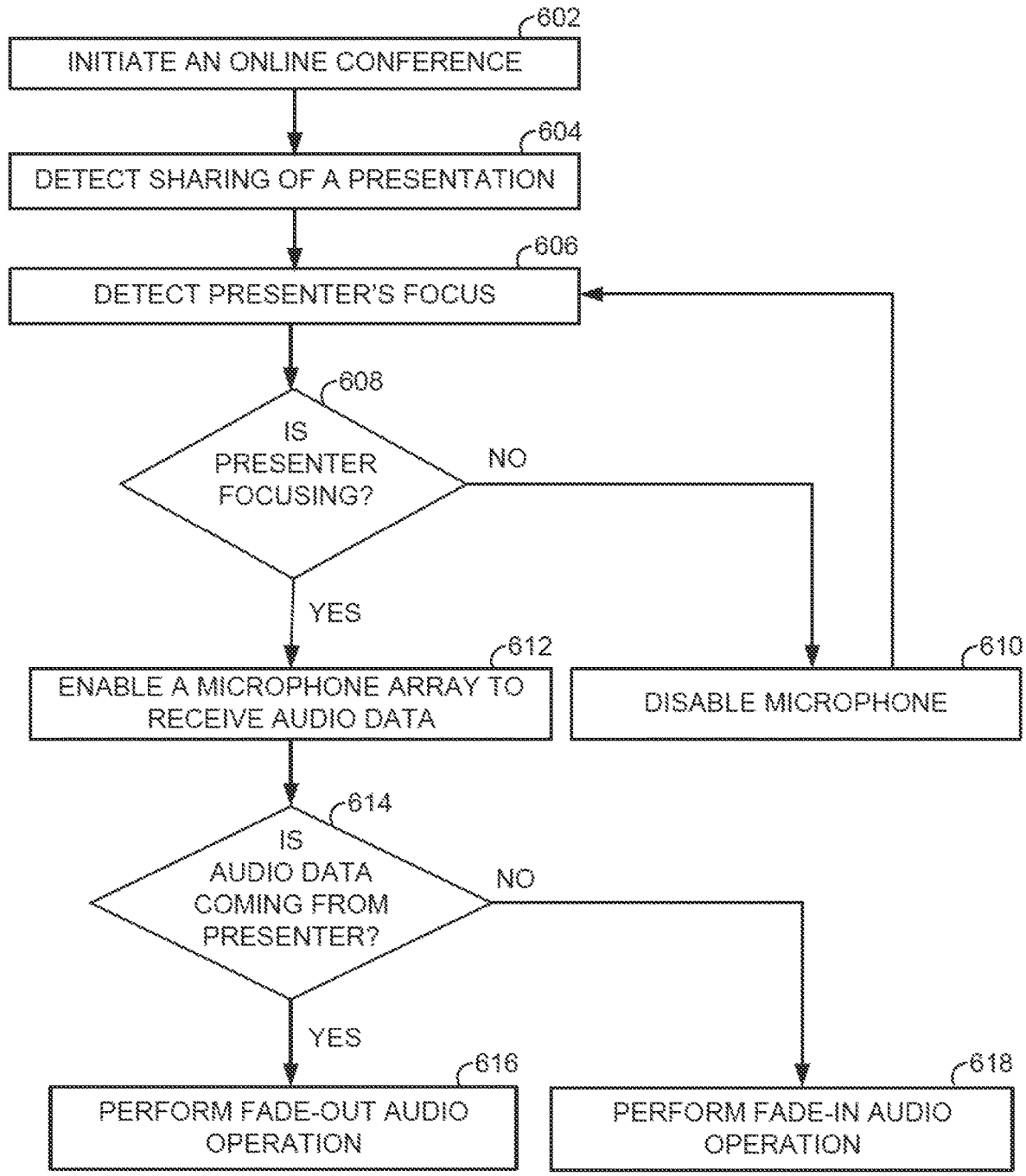
FIG. 6 is a flow diagram illustrating an example computer-implemented method for performing a fade audio operation based on presenter's voice and presenter's focus detections.

FIG. 6 is a flow diagram illustrating an example computer-implemented method 600 for performing a fade audio operation based on presenter's voice and presenter's focus detection. At 602, an online conference may be initiated via a voice over Internet protocol (VoIP) application. For example, VoIP is a method and group of technologies for the delivery of voice communications and multimedia sessions over Internet protocol (IP) networks, such as the Internet. An example form of VoIP is a software application that is installed on a computing device and enables to make calls to other users of the application such as Skype™, Zoom, and the like.

At 604, sharing of a presentation during the online conference may be detected. During sharing of the presentation, an audio stream of the presentation may be transmitted to the online conference. At 606, the presenter's focus may be detected as described in FIG. 4C. At 608, a check may be made to determine whether the presenter is focusing on the online conference (e.g., paying attention to a display device of the computing device). When the presenter is not focusing on the online conference, an audio input device (e.g., a microphone) may be disabled, at 610. Further, the process continues to detect the presenter's focus, at 606.

When the presenter is focusing on the online conference, a microphone array may be enabled to receive audio data, at 612. At 614, a check may be made to determine whether the audio data is coming from the presenter, for instance, as described in FIGS. 5A and 5B. When the audio data is coming from the presenter (e.g., the audio data is presenter's voice), a fade-out audio operation may be performed, at 616. When the audio data is not coming from the presenter (e.g., the audio data may be a background noise or a human voice not coming from a location of the presenter), a fade-in audio operation may be performed, at 618. Thus, the fade-in or fade-out audio operation may be performed based on the presenter's voice and the presenter's focus.

The processes depicted in FIGS. 4C, 5A, and 6 represent generalized illustrations, and other processes may be added, or existing processes may be removed, modified, or rearranged without departing from the scope and spirit of the present application. In addition, the processes may represent instructions stored on a computer-readable storage medium that, when executed, may cause a processor to respond, to perform actions, to change states, and/or to make decisions. Alternatively, the processes may represent functions and/or actions performed by functionally equivalent circuits like analog circuits, digital signal processing circuits, application specific integrated circuits (ASICs), or other hardware components associated with the system. Furthermore, the flow charts are not intended to limit the implementation of the present application, but rather the flow chart illustrates functional information to design/fabricate circuits, generate computer-readable instructions, or use a combination of hardware and computer-readable instructions to perform the illustrated processes.

The above-described examples are for the purpose of illustration. Although the above examples have been described in conjunction with example implementations thereof, numerous modifications may be possible without materially departing from the teachings of the subject matter described herein. Other substitutions, modifications, and changes may be made without departing from the spirit of the subject matter. Also, the features disclosed in this specification (including any accompanying claims, abstract, and drawings), and/or any method or process so disclosed, may be combined in any combination, except combinations where some of such features are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus. In addition, the terms "first" and "second" are used to identify individual elements and may not meant to designate an order or number of those elements.

The present description has been shown and described with reference to the foregoing examples. It is understood, however, that other forms, details, and examples can be made without departing from the spirit and scope of the present subject matter that is defined in the following claims.

What is claimed is:

1. A computing device comprising:
   a microphone array; and
   a processor to:
   transmit an audio stream of a presentation to an online conference;
   receive audio data from a presenter of the presentation via the microphone array while the audio stream is being transmitted;
   determine that the audio data includes voice audio of the presenter of the presentation;
   perform a fade audio operation to control an audio level of the audio stream; and
   transmit the audio data including the voice audio of the presenter of the presentation to the online conference.

2. The computing device of claim 1, wherein the processor is to:
   in response to determining the audio data includes voice audio of presenter of the presentation, perform a fade-out audio operation to reduce the audio level of the audio stream during transmission of the audio data including the voice audio to the online conference.

3. The computing device of claim 1, wherein the processor is to:
   in response to determining subsequent audio data does not include the voice data of the presenter of the presentation, perform a fade-in audio operation to increase the audio level of the audio stream of the presentation while preventing transmission of the audio received via the microphone array.

4. The computing device of claim 1, wherein the processor is to:
   estimate a location or direction of a sound source relative to the computing device based on the received audio data; and
   determine whether the audio data is voice audio of the presenter of the presentation based on the estimated location or direction of the sound source.

5. The computing device of claim 4, wherein the processor is to:
   determine the location or direction of the sound source based on a time difference of arrival of an audio signal of the audio data between a set of microphones of the microphone array.

6. The computing device of claim 4, wherein the processor is to:
   determine the location or direction of the sound source based on an intensity of an audio signal of the audio data detected individually by a set of microphones of the microphone array.

7. A computing device comprising:
   an audio input device;
   a camera; and
   a processor to:
   transmit an audio stream of a presentation to an online conference;
   detect, via the camera, a focus of a presenter of the presentation on the online conference;
   determine that the presenter is focusing on the online conference;
   enable the audio input device to receive audio data via the audio input device;
   perform a fade audio operation to control an audio level of the audio stream; and
   transmit audio data including voice audio of the presenter of the presentation to the online conference.

8. The computing device of claim 7, wherein the processor is to:
   in response to determining the audio data is voice audio of the presenter of the presentation, perform the fade audio operation to control the audio level of the audio stream.

9. The computing device of claim 8, wherein the processor is to:
   in response to determining the audio data does not include voice audio of the presentation, perform a fade-in audio operation to increase the audio level of the audio stream and prevent transmitting of the audio data of the presenter.

10. The computing device of claim 8, wherein the processor is to:
    estimate a location or direction of a sound source relative to the audio input device based on the captured audio data; and
    determine whether the audio data including voice audio is coming from the presenter of the presentation based on the estimated location or direction of the sound source.

11. The computing device of claim 7, wherein the processor is to:
    in response to determining that the presenter is not focusing on the online conference,
    disable the fade audio operation; and
    disable the audio input device.

12. The computing device of claim 7, wherein the processor is to:
    capture an image of a presenter operating the computing device via the camera;
    detect an angular position of the presenter's eye, the presenter's head, the presenter's body, or any combination thereof using the captured image; and
    detect the focus of the presenter on the online conference based on the detected angular position.

13. The computing device of claim 7, wherein the audio input device comprises a microphone or an array of microphones.

14. A non-transitory computer-readable storage medium storing instructions executable by a processor of a computing device to:
- receive audio data via a microphone array while an audio stream of the presentation is being transmitted to an online conference;
- determine whether the audio data is coming from a presenter of the presentation;
- capture an image of the presenter operating the computing device via a camera;
- determine whether the presenter is focusing on the online conference based on the captured image; and
- based on determining whether the audio data is coming from the presenter and the presenter is focusing on the online conference, selectively transmit either the audio data of the presenter or the audio stream of the presentation to the online conference.

15. The non-transitory computer-readable storage medium of claim 14, wherein instructions to selectively transmit either the audio data of the presenter or the audio stream of the presentation comprise instructions to:
- in response to determining that the audio data is coming from the presenter and the presenter is focusing on the online conference, transmit the audio data of the presenter to the online conference while preventing the transmission of the audio stream of the presentation; and
- in response to determining that the audio data is not coming from the presenter, the presenter is not focusing on the online conference, or both, transmit the audio stream of the presentation to the online conference while preventing the transmission of the audio data of the presenter.

16. The non-transitory computer-readable storage medium of claim 14, wherein instructions to determine whether the audio data is coming from the presenter comprise instructions to:
- create a hyperbola of a first microphone and a second microphone of the microphone array;
- determine a location of a sound source with respect to the hyperbola; and
- determine whether the audio data is coming from the presenter based on the location of the sound source with respect to the hyperbola.

17. The non-transitory computer-readable storage medium of claim 14, wherein instructions to determine whether the audio data is coming from the presenter comprise instructions to:
- extract frequency components of human voice from the audio data; and
- determine whether the audio data is coming from the presenter using the extracted frequency components.

18. The non-transitory computer-readable storage medium of claim 14, wherein instructions to determine whether the presenter is focusing on the online conference comprise instructions to:
- extract a user position characteristic from the image;
- compare, based on the user position characteristic, the image to a database including:
  - images indicative that users are focusing on corresponding computing devices; and
  - images indicative that users are not focusing on corresponding computing devices; and
- determine, based on the comparison, whether the presenter is focusing on the computing device.

19. The non-transitory computer-readable storage medium of claim 18, wherein the user position characteristic comprises user eye position information, user head position information, user body position information, or any combination thereof.

* * * * *